(12) United States Patent
Brox

(10) Patent No.: US 10,553,259 B2
(45) Date of Patent: Feb. 4, 2020

(54) SEMICONDUCTOR DIES SUPPORTING MULTIPLE PACKAGING CONFIGURATIONS AND ASSOCIATED METHODS

(71) Applicant: Micron Technology, Inc., Boise, ID (US)

(72) Inventor: Martin Brox, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/684,577

(22) Filed: Aug. 23, 2017

(65) Prior Publication Data

US 2019/0066738 A1 Feb. 28, 2019

(51) Int. Cl.

| | |
|---|---|
| *G11C 7/10* | (2006.01) |
| *H01L 25/00* | (2006.01) |
| *G11C 5/04* | (2006.01) |
| *G11C 5/06* | (2006.01) |
| *H01L 23/525* | (2006.01) |
| *H01L 25/065* | (2006.01) |
| *H01L 23/00* | (2006.01) |

(52) U.S. Cl.
CPC ............. *G11C 7/1006* (2013.01); *G11C 5/04* (2013.01); *G11C 5/06* (2013.01); *G11C 7/1045* (2013.01); *H01L 23/5252* (2013.01); *H01L 23/5256* (2013.01); *H01L 25/50* (2013.01); *G11C 5/066* (2013.01); *G11C 2207/105* (2013.01); *H01L 24/13* (2013.01); *H01L 24/16* (2013.01); *H01L 24/29* (2013.01); *H01L 24/32* (2013.01); *H01L 24/48* (2013.01); *H01L 25/0655* (2013.01); *H01L 2224/131* (2013.01); *H01L 2224/16227* (2013.01); *H01L 2224/2919* (2013.01); *H01L 2224/32225* (2013.01); *H01L 2224/48227* (2013.01); *H01L 2924/1434* (2013.01)

(58) Field of Classification Search
CPC .................................................... G11C 7/1006
USPC ...................................................... 365/230.01
See application file for complete search history.

(56) References Cited

U.S. PATENT DOCUMENTS

2004/0230743 A1* 11/2004 Ware ................... G06F 13/1684
                                                                                   711/115
2014/0264906 A1*  9/2014 Fai ....................... H01L 23/5384
                                                                                   257/774

* cited by examiner

*Primary Examiner* — Alfredo Bermudez Lozada
(74) *Attorney, Agent, or Firm* — Perkins Coie LLP

(57) ABSTRACT

A memory device configured to support multiple memory densities is provided. The memory device includes a first plurality of electrical contacts corresponding to a first command/address channel, a second plurality of electrical contacts corresponding to a second command/address channel, a third plurality of electrical contacts corresponding to a first data bus, a fourth plurality of electrical contacts corresponding to a second data bus, and mode selection circuitry configured to place the memory device in the first mode or the second mode. In the first mode, the first plurality of memory cells is operatively coupled to the first and third pluralities of electrical contacts and the second plurality of memory cells is operatively coupled to the second and fourth plurality of electrical contacts. In the second mode, the first and second pluralities of memory cells are both operatively coupled to the first and third pluralities of electrical contacts.

13 Claims, 5 Drawing Sheets

SEMICONDUCTOR DIES SUPPORTING MULTIPLE PACKAGING CONFIGURATIONS AND ASSOCIATED METHODS

TECHNICAL FIELD

The present technology generally relates to semiconductor devices, and more particularly to semiconductor dies able to support multiple packaging configurations.

BACKGROUND

Semiconductor devices are often provided in packages with multiple connected dies, in which circuit elements of the dies are connected in various ways. The semiconductor dies are often designed to be packaged in a particular configuration such that the circuit elements are configured to only support a particular memory density of the package. As newer generations of memory are developed, the memory density in which memory packages are offered changes over time. For example, the memory density for one generation of memory packages may be 8 Gb, and the memory density for a subsequent generation of memory packages may be 16 Gb. Semiconductor manufacturers supplying the memory dies to be implemented on both the older and newer packages have traditionally designed a first memory die configured to support the first memory density (e.g., 8 Gb) and a second memory die to support the second memory density (e.g., 16 Gb). One drawback of this approach is that semiconductor manufacturers endure significant costs from the design, production, marketing, and shipment of two separate memory dies throughout the transition period from one generation to another.

DETAILED DESCRIPTION

For ease of reference, throughout this disclosure identical reference numbers are used to identify similar or analogous components or features, but the use of the same reference number does not imply that the parts should be construed to be identical. Indeed, in many examples described herein, the identically-numbered parts are distinct in structure and/or function. Furthermore, the same shading may be used to indicate materials in a cross section that can be compositionally similar, but the use of the same shading does not imply that the materials should be construed to be identical.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

Specific details of several embodiments of semiconductor assemblies and methods of manufacturing such assemblies are described below. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies. The term "semiconductor die" generally refers to a die having integrated circuits or components, data storage elements, processing components, and/or other features manufactured on semiconductor substrates. For example, semiconductor dies can include integrated circuit memory and/or logic circuitry. The term "semiconductor package" can refer to an arrangement with one or more semiconductor devices incorporated into a common package. A semiconductor package can include a housing or casing that partially or completely encapsulates at least one semiconductor device. A semiconductor package can also include an interposer substrate that carries one or more semiconductor devices and is attached to or otherwise incorporated into the casing. The term "package assembly" can refer to an assembly of one or more individual semiconductor packages stacked on each other. A person skilled in the relevant art will also understand that the technology may have additional embodiments, and that the technology may be practiced without several of the details of the embodiments described below with reference to FIGS. 1A-5.

Figure 1A:
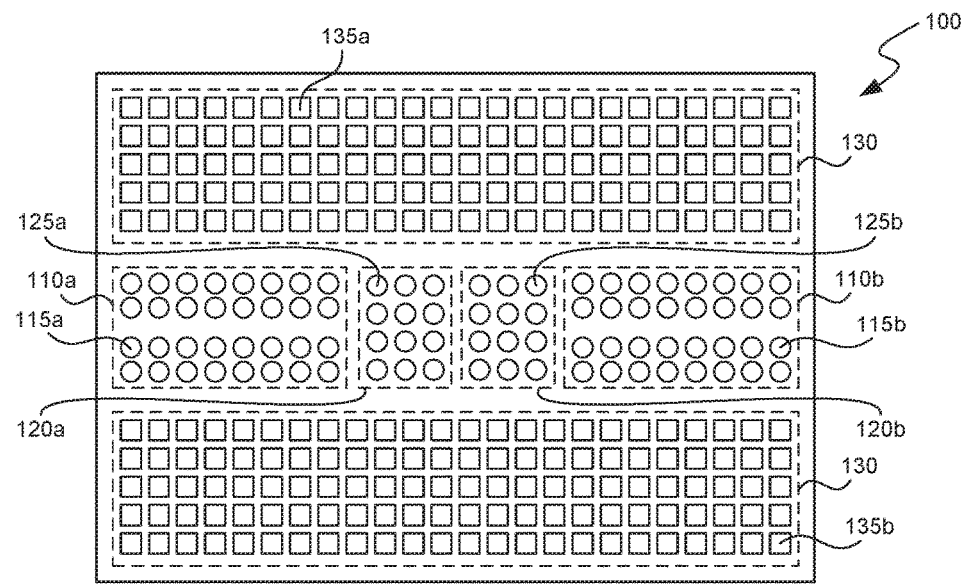
FIG. 1A is a schematic view of a semiconductor die configured in accordance with an embodiment of the present technology.

FIG. 1A is a schematic view of a semiconductor die 100 ("die 100") configured in accordance with an embodiment of the present technology. The die 100 can include various types of semiconductor components and functional features, such as dynamic random-access memory (DRAM), static random-access memory (SRAM), flash memory, and/or other forms of integrated circuit memory. The die 100 can further include a plurality of electrical contacts (e.g., pads, pins, balls, etc.) corresponding to command/address functionality and/or data transfer functionality. In the illustrated embodiment, the die 100 includes a first plurality of electrical contacts 125a corresponding to a first command/address channel 120a, a second plurality of electrical contacts 125b corresponding to a second command/address channel 120b, a third plurality of electrical contacts 115a corresponding to a first data bus 110a, a fourth plurality of electrical contacts 115b corresponding to a second data bus 110b, and a memory array 130 including a first plurality of memory cells 135a and a second plurality of memory cells 135b. The memory cells 135a-b of the die 100 store data and can be operatively coupled to (a) the first and/or second command/address channels 120a-b and (b) the first and/or second data buses 110a-b. The memory cells 135a-b can include, for example, capacitive, resistive, phase change, ferromagnetic, ferroelectric and/or other suitable storage elements configured to store data persistently or semi-persistently. The die 100 can also include other circuit components (e.g., memory subsystems), such as multiplexers, decoders, buffers, read/write drivers, address registers, data out/data in registers, etc. (not shown), for accessing and/or programming (e.g., writing) the memory cells 135a-b and other functionality, such as for processing information and/or communicating with a connected host.

The die 100 further includes mode selection circuitry configured to place and operate the die 100 in multiple modes including a first mode or a second mode. In the first mode, the first and second command/address channels 120a-b each provide memory command/address signals to a corresponding one of the first and second plurality of memory cells 135a-b. For example, the first command/address channel 120a can provide command/address signals to only the first plurality of memory cells 135a, and the second command/address channel 120b can provide command/address signals to only the second plurality of memory cells 135b. In the first mode, the first and second data buses 110a-b each receive and transmit data signals between a corresponding one of the first and second pluralities of memory cells 135a-b and a connected host during memory access operations. For example, the first data bus 110a can receive and transmit data signals to/from the first plurality of memory cells 135a, and the second data bus 110b can receive and transmit data signals to/from the second plurality of memory cells 135b. In the second mode, only one of the first and second command/address channels 120a-b on the die 100 provides memory command/address signals to both of the first and second plurality of memory cells 135a-b. Additionally, in the second mode, only one of the first and second data buses 110a-b on the die 100 receives and transmits data signals between both the first and second pluralities of memory cells 135a-b and the connected host.

In the illustrated embodiment, the first and second pluralities of electrical contacts 125a and 125b are reflectively symmetric about a central axis in the plane of the die, and are rotationally symmetric about an axis perpendicular to the plane of the die. Similarly, the third and fourth pluralities of electrical contacts 115a and 115b are reflectively symmetric about a central axis in the plane of the die, and are rotationally symmetric about an axis perpendicular to the plane of the die. A person of ordinary skill in the art will recognize that the illustrated embodiment represents a schematic view of the die 100, and that other symmetric or non-symmetric configurations with similar functionality may be implemented.

A person of ordinary skill in the art will recognize that the die 100 can have other configurations. For example, in some embodiments, the third and fourth pluralities of electrical contacts 115a-b corresponding to the first and second data buses 110a-b can be arranged into different configurations. For example, the third and fourth pluralities of electrical contacts 115a-b can each be separated into two or more separate pluralities of electrical contacts. In such an embodiment, the die would include a fifth plurality of electrical contacts corresponding to a third data bus and a sixth plurality of electrical contacts corresponding to a fourth data bus.

Figure 1B:
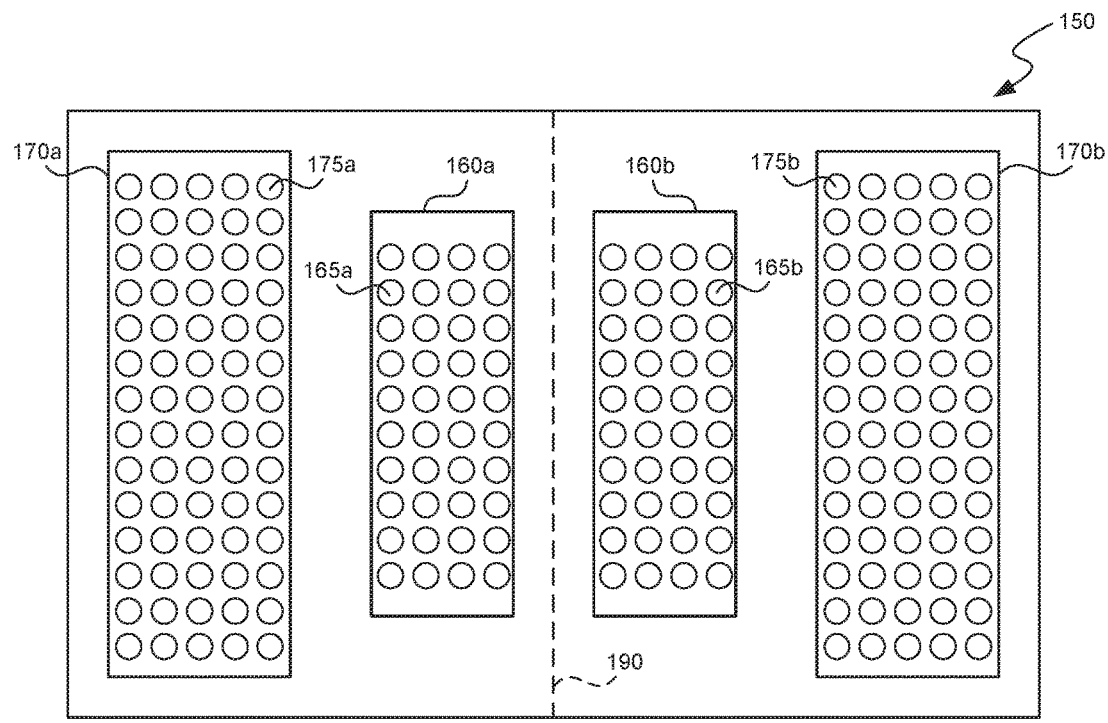
FIG. 1B is a schematic view of a semiconductor package substrate configured in accordance with an embodiment of the present technology.

FIG. 1B is a schematic view of a semiconductor package substrate 150 ("substrate 150") configured in accordance with an embodiment of the present technology. The substrate 150 includes a first plurality of package electrical contacts 165a corresponding to a first command/address channel 160a, a second plurality of package electrical contacts 165b corresponding to a second command/address channel 160b, a third plurality of package electrical contacts 175a corresponding to a first data bus 170a, and a fourth plurality of package electrical contacts 175b corresponding to a second data bus 170b. The first and second command/address channels 160a-b can provide memory command/address signals to one or more attached memory devices, and the data buses 170a-b can provide data signaling to and from the one or more attached memory devices. In some embodiments, the substrate 150 can be used in a memory package with a two-channel architecture. Moreover, the substrate is generally symmetric about the vertical axis 190 between the first and second plurality of package electrical contacts 165a-b.

A person of ordinary skill in the art will recognize that the substrate 150 can have other configurations. For example, in some embodiments, the substrate 150 can be used in a memory package with an architecture having two or more channels. Additionally, in some embodiments, the third and fourth pluralities of package electrical contacts 170a-b can be arranged into different configurations. For example, the third and fourth pluralities of package electrical contacts 170a-b can each be separated into two or more separate pluralities of package electrical contacts, each corresponding to a separate data bus. Such an embodiment may correspond to, for example, a four byte design commonly used for graphics memory modules (e.g., GDDR6 SDRAM).

Figure 2:
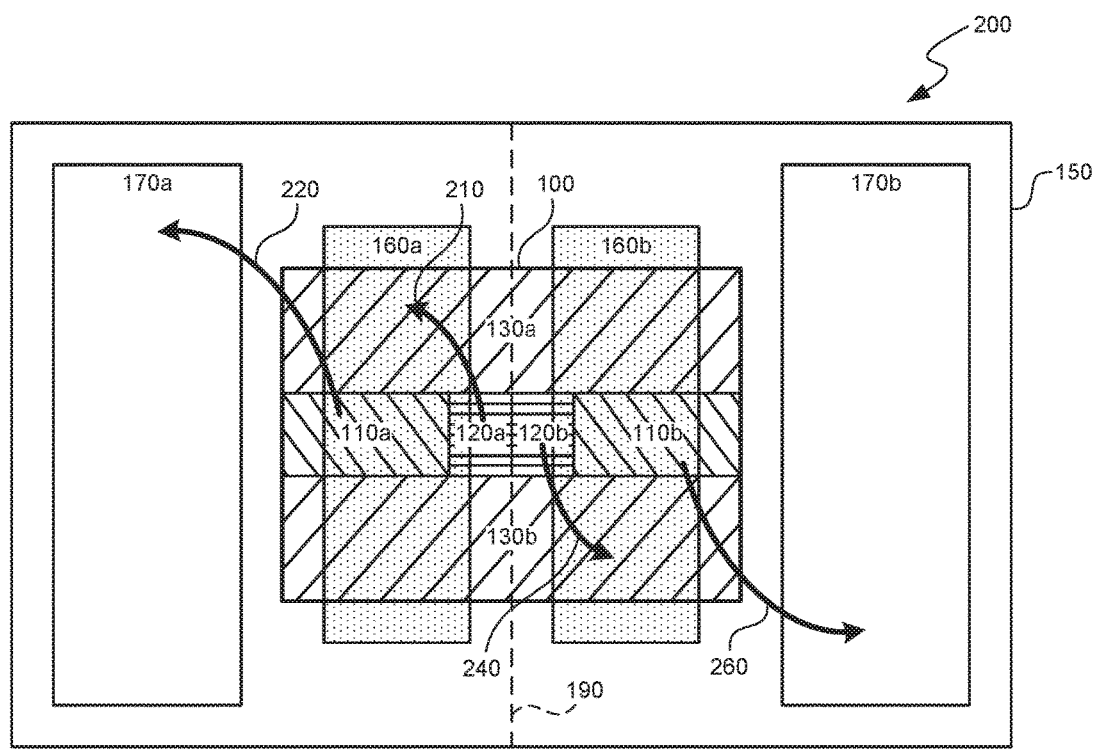
FIGS. 2 and 3 are schematic views of memory devices configured in accordance with embodiments of the present technology.
Figure 3:
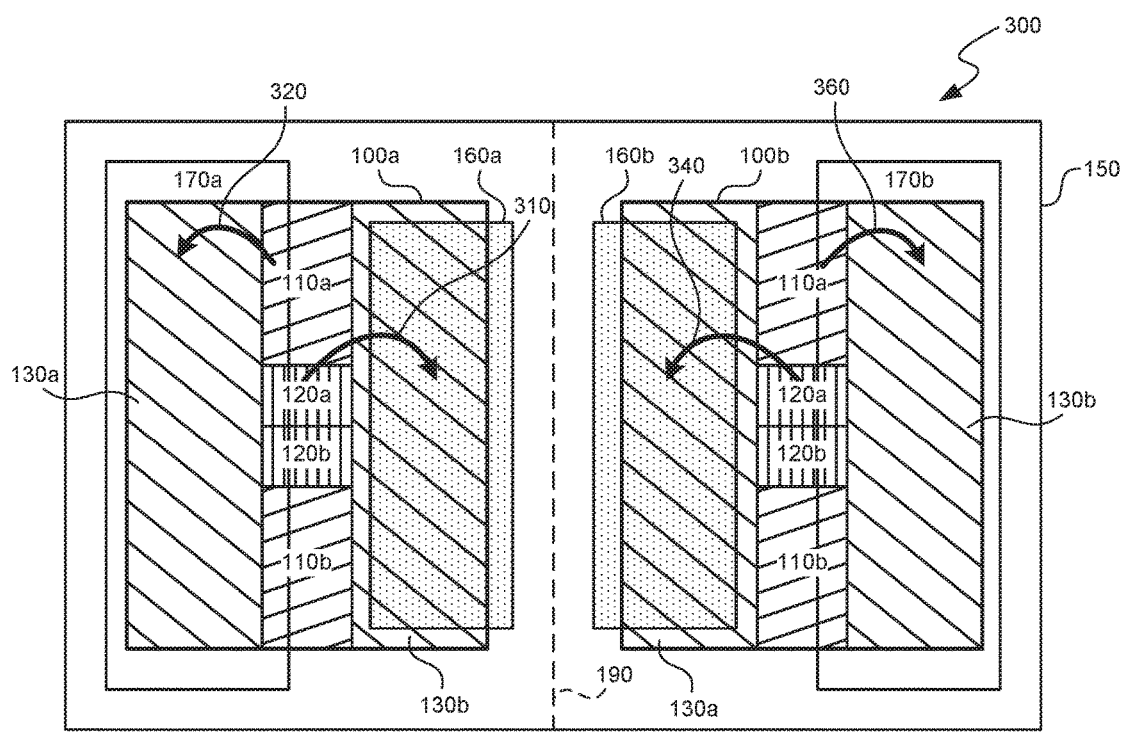

As previously mentioned, there exists a need for a die capable of supporting multiple memory package configurations, or more specifically, multiple memory densities. One feature of the present technology is the ability to operate a memory die in either a first mode or a second mode and thus be capable of supporting memory packages with different memory densities. FIGS. 2 and 3 are schematic views of memory devices configured in accordance with embodiments of the present technology. FIG. 2 illustrates an embodiment in which a single die 100 configured to operate in the first mode (e.g., a dual-channel mode) is provided, and FIG. 3 illustrates an embodiment in which two dies 100 configured to operate in the second mode (e.g., a single-channel mode) are provided. It is intended that the die 100 and substrate 150 shown in FIGS. 2 and 3 include the pluralities of electrical contacts 115a-b and 125a-b and the pluralities of package electrical contacts 165a-b and 175a-b shown and described with reference to FIGS. 1A and 1B. For ease of viewability, however, these electrical contacts are not displayed in FIGS. 2 and 3.

Referring first to FIG. 2, a semiconductor assembly 200 ("assembly 200") includes a single die 100 packaged onto the substrate 150 and configured to operate in the first mode. The die 100 is generally symmetrical about the vertical axis 190, and is functionally split into a first half and a second half, each of which supports one of the two channels of the assembly 200. In the first mode, the first and second command/address channels 120a-b each provides memory command/address signals to only one of the first and second plurality of memory cells 135a-b. Accordingly, the first and second command/address channels 160a-b of the substrate 150 are each coupled to only one of the first and second plurality of memory cells 135a-b via a single one of the first and second command/address channels 120a-b. Similarly, in the first mode, the first and second data buses 110a-b each receives and transmits data signals to/from only one of the first and second plurality of memory cells 135a-b. Accordingly, the first and second data buses 170a-b of the substrate 150 are each coupled to only one of the first and second plurality of memory cells 135a-b via a single one of the first and second data buses 110a-b. Additionally, the first and second data buses 110a-b on the memory die 100 are all utilized to communicate data from the memory cells 135a-b on the die 100 to at least one of the first or second data buses 170*a-b* on the substrate 150. For example, the first data bus 110*a* is being utilized to communicate data from the first plurality of memory cells 135*a*, and the second data bus 110*b* is utilized to communicate data from the second plurality of memory cells 135*b*.

In the illustrated embodiment of FIG. 2, the first plurality of electrical contacts 125*a* (FIG. 1A) corresponding to the first command/address channel 120*a* of the die 100 is operatively coupled to the first plurality of package electrical contacts 165*a* (FIG. 1B) corresponding to the first command/address channel 160*a* via a plurality of interconnects 210, and the third plurality of electrical contacts 115*a* (FIG. 1A) corresponding to the first data bus 110*a* of the die 100 is operatively coupled to the third plurality of package electrical contacts 175*a* (FIG. 1B) corresponding to the first data bus 170*a* via the plurality of interconnects 220. Additionally, the second plurality of electrical contacts 125*b* (FIG. 1A) corresponding to the second command/address channel 120*b* of the die 100 is operatively coupled to the fourth plurality of package electrical contacts 165*b* (FIG. 1B) corresponding to the second command/address channel 160*b* via a plurality of interconnects 240, and the third plurality of electrical contacts 115*b* (FIG. 1A) corresponding to the second data bus 110*b* of the die 100 are operatively coupled to the fourth plurality of package electrical contacts 175*b* (FIG. 1B) corresponding to the second data bus 170*b* via the plurality of interconnects 260. Structures operatively coupled to one another are configured to exchange data therebetween, and can be connected via interconnects such as wirebonds, TSVs, redistribution structures, conductive links, and/or other known structures or means.

FIG. 3 is a schematic view of a semiconductor assembly 300 ("assembly 300"). The assembly 300 includes first and second dies 100*a-b* ("dies 100*a-b*") packaged on the substrate 150. The dies 100*a-b* are structurally identical to the die 100 previously described with reference to FIG. 1A, but are functionally different in that the dies 100*a-b* are configured to operate in the second mode. In the illustrated embodiment, the dies 100*a-b* are rotated 90 degrees clockwise compared to die 100 in FIG. 2 and packaged onto the package 150.

As shown in FIG. 3, in the second mode, a single one of the first and second command/address channels 120*a-b* can provide memory command/address signals to both the first and second plurality of memory cells 135*a-b*. Additionally, a single one of the first and second data buses 110*a-b* can receive and/or transmit data signals for both the first and second plurality of memory cells 135*a-b*. Accordingly, in the second mode, (a) only one of the first and second command/address channels 120*a-b* for each of the dies 100*a-b* is coupled to the substrate 150, and (b) only one of the first and second data buses 110*a-b* for each of the dies 100*a-b* is coupled to the substrate 150. For example, the second command/address channel 120*b* on the first die 100*a* is not being utilized, and the second command/address channel 120*b* on the second die 100*b* is not being utilized. Additionally, the second data bus 110*b* on the first die 100*a* is not being utilized, and the second data bus 110*b* on the second die 100*b* is not being utilized. Accordingly, in the second mode, the second plurality of electrical contacts 125*b* corresponding to the second command/address channel 120*b*, and the fourth plurality of electrical contacts 115*b* corresponding to the second data bus 110*b* are not operatively coupled to the substrate 150.

In the illustrated embodiment of FIG. 3, the first plurality of electrical contacts 125*a* (FIG. 1A) corresponding to the first command/address channel 120*a* of the die 100*a* is operatively coupled to the first plurality of package electrical contacts 165*a* (FIG. 1B) corresponding to the first command/address channel 360*a* via a plurality of interconnects 310. Additionally, the third plurality of electrical contacts 115*a* (FIG. 1A) corresponding to the first data bus 110*a* of the die 100*a* is operatively coupled to the third plurality of package electrical contacts 175*a* (FIG. 1B) corresponding to the first data bus 170*a* via a plurality of interconnects 320. Additionally, the first plurality of electrical contacts 125*a* (FIG. 1A) corresponding to the first command/address channel 120*a* of the die 100*b* is operatively coupled to the second plurality of package electrical contacts 165*b* (FIG. 1B) corresponding to the second command/address channel 160*b* via the plurality of interconnects 340. Additionally, the third plurality of electrical contacts 115*a* (FIG. 1A) corresponding to the first data bus 110*a* of the die 100*b* is operatively coupled to the fourth plurality of package electrical contacts 175*a* (FIG. 1B) corresponding to the second data bus 170*b* via the plurality of interconnects 360.

As previously described and shown in FIG. 3, the second command/address channel 120*b* and the second data bus 110*b* on the first and second dies 100*a-b* are not utilized in the second mode. As such, the second plurality of electrical contacts 125*b* corresponding to the second command/address channel 120*b*, and the fourth plurality of electrical contacts 115*b* corresponding to the second data bus 110*b*, are not operatively coupled to the substrate 150. In some embodiments when the first and second dies 100*a-b* are configured to operate in the second mode, the second plurality of electrical contacts 125*b* and/or the fourth plurality of electrical contacts 115*b* may be electrically disconnected from the first and/or second plurality of memory cells 135*a-b*. Electrically disconnecting these electrical contacts can reduce impedance, capacitance, and/or other parasitic effects, and can thereby improve the operating efficiency of the dies 100*a-b* and/or the device 300.

One benefit of the present technology is the ability for a single die (e.g., the die 100) to be implemented into multiple package configurations (e.g., the packages 250 and 350) with different memory densities. As such, because the single die can be configured to operate in either a single die mode (e.g., the first mode) or a dual die mode (e.g., the second mode), the same single die can be used to support different specifications of memory capacity (e.g., 8 Gb or 16 Gb). As such, the single die allows manufacturers to produce a single die, thereby saving costs associated with production and logistics of the single dies.

A person of ordinary skill in the art will understand that other embodiments may be used to achieve the same general functionality previously described with reference to FIG. 3. In some embodiments, the die 100 may be configured to operate in additional modes in addition to the first and second mode previously described, such as a third mode and/or a fourth mode. In such an embodiment, the die 100 could further include a fifth plurality of electrical contacts corresponding to a third command/address channel, a sixth plurality of electrical contacts corresponding to a fourth command/address channel, a seventh plurality of electrical contacts corresponding to a third data bus, and an eighth plurality of electrical contacts corresponding to a fourth data bus. In such an embodiment, the die could be placed in a third mode to support a quad memory density (e.g., 32 Gb). Stated otherwise, the die could be configured to operate in (a) a first mode to support a single memory density (e.g., 8 Gb), (b) a second mode to support a dual memory density (e.g., 16 Gb), and (c) a third mode to support a quad memory density (e.g., 32 GB). A person of ordinary skill in the art will understand that the die could be further modified to support additional memory densities by adding additional command/address channels and data buses.

Figure 4:
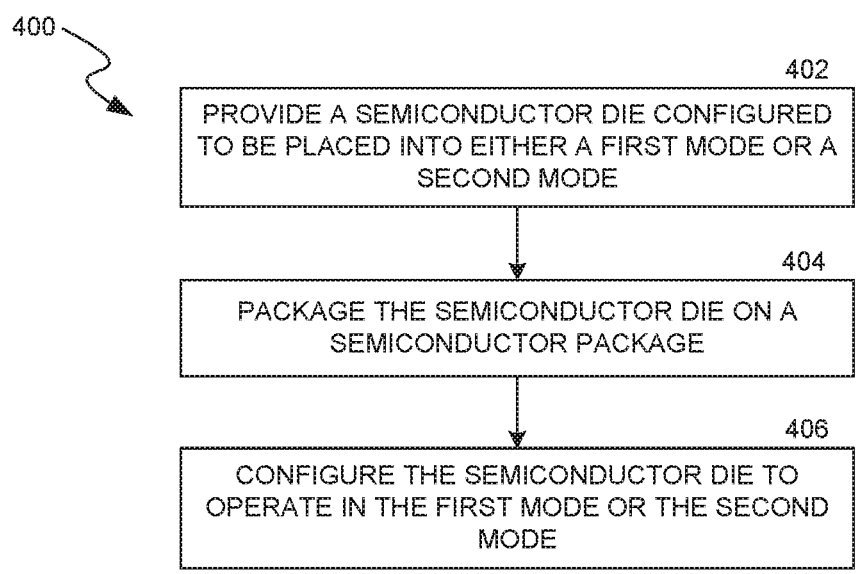
FIG. 4 is a flow chart illustrating a method of forming a semiconductor device configured in accordance with an embodiment of the technology.

FIG. 4 is a flow chart illustrating a method 400 of manufacturing a semiconductor assembly (e.g., assembly 200 or assembly 300). Process portion 402 includes providing a semiconductor die (e.g., die 100) having a first plurality of electrical contacts (e.g., electrical contacts 125a) corresponding to a first command/address channel (e.g., first command/address channel 120a), a second plurality of electrical contacts (e.g., electrical contacts 125b) corresponding to a second command/address channel (e.g., second command/address channel 120b), a third plurality of electrical contacts (e.g., electricals contacts 115a) corresponding to a first data bus (e.g., first data bus 110a), a fourth plurality of electrical contacts (e.g., electrical contacts 115b) corresponding to a second data bus (e.g., second data bus 110b), and a memory array including first and second plurality of memory cells (e.g., memory cells 135a-b). The semiconductor can be configured to operate in either the first mode or the second mode described in greater detail above. As such, the semiconductor die includes mode selection circuitry capable of placing the semiconductor into either the first mode or the second mode.

Process portion 404 includes packaging the semiconductor die on a semiconductor package substrate (e.g., substrate 150) to create a semiconductor device (e.g., assembly 200 or assembly 300). Packaging can include attaching the semiconductor die to the package substrate via electrical connectors (e.g., solder balls) or an adhesive tape (e.g., a die attach film), and/or electrically connecting the semiconductor die to the semiconductor package using interconnects (e.g., wirebonds, TSVs, redistribution structures, conductive links, etc.). In some embodiments, electrically connecting portions of the semiconductor die to the package substrate may be dependent on whether the package will include a single die or multiple dies. For example, if the semiconductor die is to be one of multiple semiconductor dies in the package, then only a portion of the command/address channels and/or data buses of the semiconductor die may be electrically connected to package electrical contacts corresponding to command/address channels and data buses of the memory package during the packaging step.

Process portion 406 includes configuring the semiconductor die to operate in either the first mode or the second mode, as previously described with reference to FIGS. 1A-3. If a single semiconductor die is implemented on the semiconductor package, then the semiconductor die is configured to operate in the first mode, and if two semiconductor dies are implemented on the semiconductor package, then each semiconductor die is configured to operate in the second mode. Configuring the semiconductor die can include semi-permanently altering the semiconductor die to operate in either the first mode or the second mode via hardware, firmware or a logic operation. In some embodiments, configuring the semiconductor die can be done automatically using sensors on the die to detect inputs that indicate whether the semiconductor die should be placed in the first mode or the second mode. For example, sensors can determine a power input to the semiconductor die, and based upon whether the power input is above or below a predetermined threshold, automatically place the semiconductor die into the first mode or the second mode using firmware and/or logic. As a more specific example, a voltage input of about 1V may place the semiconductor die in the first mode, and a voltage input of about 0V may place the semiconductor die in the second mode.

In some embodiments, configuring the semiconductor die can also be done by programmable links (e.g., fuses or anti-fuses). When the fuses are exposed to high voltages, current flow can cause the fuse to overheat and "blow," thereby creating an open circuit. The fuses can be strategically placed on the semiconductor die and/or package substrate during manufacturing such that the blowing of specific fuses result in the semiconductor die being programmed to either the first mode or the second mode.

Process portion 406 can occur before or after the process portion 404. In some embodiments, it may be beneficial to package the semiconductor die after programming because, depending on whether the semiconductor die is to be placed in the first mode or the second mode, not all of the electrical connections between the semiconductor die and the package substrate may need to be made. For example, if the semiconductor die is to be placed in the second mode, a portion of the command/address channels and/or data buses of the semiconductor die may not be utilized and/or electrically connected to the package substrate.

Figure 5:
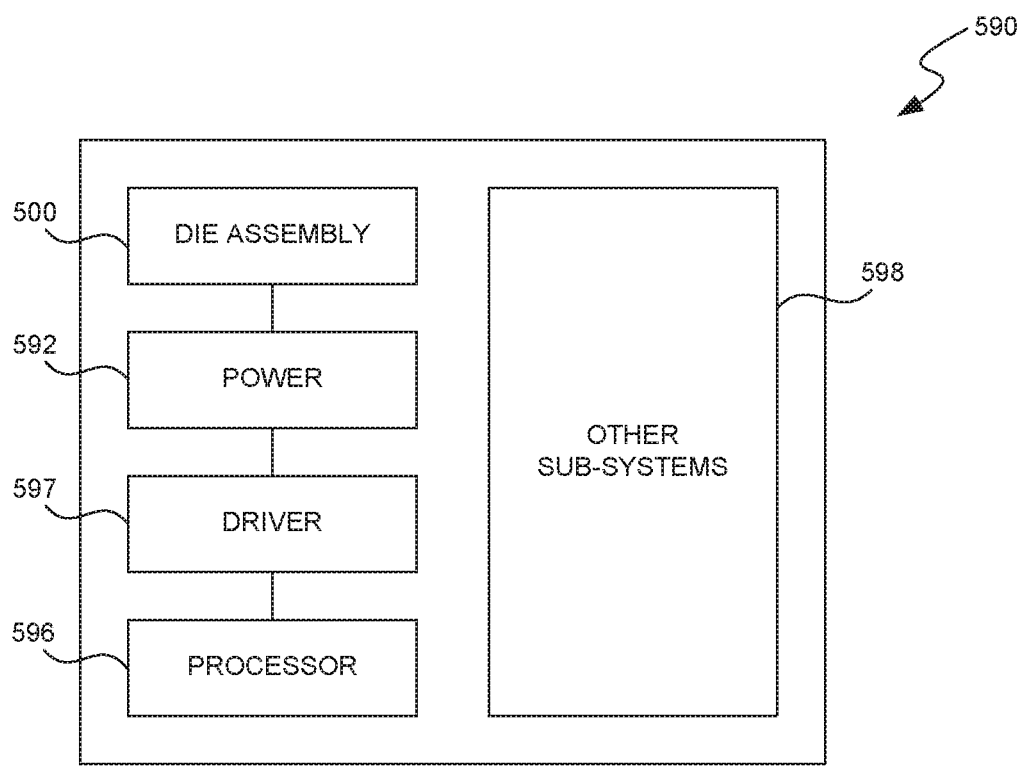
FIG. 5 is a schematic view of a system that includes a semiconductor assembly configured in accordance with an embodiment of the present technology.

Any one of the semiconductor devices and/or assemblies described above with reference to FIGS. 1A-4 can be incorporated into any of a myriad of larger and/or more complex systems, a representative example of which is system 590 shown schematically in FIG. 5. The system 590 can include a semiconductor assembly 500 ("assembly 500"), a power source 592, a driver 594, a processor 596, and/or other subsystems or components 598. The assembly 500 can include features generally similar to those assemblies described above. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, and appliances. Components of the system 590 may be housed in a single unit or distributed over multiple, interconnected units (e.g., through a communications network). The components of the system 590 can also include remote devices and any of a wide variety of computer readable media.

From the foregoing, it will be appreciated that specific embodiments of the invention have been described herein for purposes of illustration, but that various modifications may be made without deviating from the scope of the invention. Accordingly, the invention is not limited except as by the appended claims.

I claim:
1. A semiconductor die comprising:
    a first plurality of electrical contacts corresponding to a first command/address channel;
    a second plurality of electrical contacts corresponding to a second command/address channel;
    a third plurality of electrical contacts corresponding to a first data bus;
    a fourth plurality of electrical contacts corresponding to a second data bus;
    a memory array including first and second pluralities of memory cells; and
    mode selection circuitry configured to place the semiconductor die into either a first mode or a second mode, wherein the first mode operatively couples the first plurality of memory cells to the first and third pluralities of electrical contacts and the second plurality of memory cells to the second and fourth pluralities of electrical contacts, wherein the second mode operatively couples the first and second pluralities of memory cells to the first and third pluralities of electrical contacts, and wherein the first mode corresponds to a first orientation of the semiconductor die and the second mode corresponds to a second orientation of the semiconductor die different than the first orientation, wherein the second orientation of the semiconductor die is rotated about 90 degrees relative to the first orientation of the semiconductor die.

2. A semiconductor package comprising a single semiconductor die according to claim 1, wherein the mode selection circuitry of the single semiconductor die is configured to place the semiconductor die into the first mode.

3. A semiconductor package comprising two of the semiconductor die according to claim 1, wherein the mode selection circuitry of each of the two semiconductor dies is configured to place the corresponding semiconductor die into the second mode.

4. The semiconductor die of claim 1, wherein the first plurality of memory cells are addressable over the first command/address channel and the second plurality of memory cells are addressable over the second command/address channel when the mode selection circuitry is configured to place the semiconductor die into the first mode.

5. The semiconductor die of claim 1, wherein the first and second pluralities of memory cells are addressable over the first command/address channel when the mode selection circuitry is configured to place the semiconductor die into the second mode.

6. The semiconductor die of claim 1, wherein—
the first plurality of memory cells are operatively coupled to the first data bus and the second plurality of memory cells are operatively coupled to the second data bus when the mode selection circuitry is configured to place the semiconductor die into the first mode, and
the first and second pluralities of memory cells are operatively coupled to the first data bus when the mode selection circuitry is configured to place the semiconductor die into the second mode.

7. The semiconductor die of claim 1, wherein the first and second pluralities of memory cells are electrically disconnected from the second and fourth plurality of electrical contacts when the mode selection circuitry is configured to place the semiconductor die into the second mode.

8. The semiconductor die of claim 1, wherein the first and second pluralities of electrical contacts are reflectively or rotationally symmetric about an axis of the semiconductor die.

9. The semiconductor die of claim 1, wherein the third and fourth pluralities of electrical contacts are reflectively or rotationally symmetric about an axis of the semiconductor die.

10. The semiconductor die of claim 1, wherein the mode selection circuitry is configured to—
detect a power input to the semiconductor die; and
based on the detected power input, determine whether the semiconductor die is to be placed into the first mode or the second mode.

11. The semiconductor die of claim 1, wherein the mode selection circuitry includes one or more fuses or anti-fuses configured to place the semiconductor die into either the first mode or the second mode.

12. The semiconductor die of claim 1 wherein the first orientation is in a first semiconductor package having a first memory density, and the second orientation is in a second semiconductor package having a second memory density.

13. The semiconductor die of claim 1 wherein, in the first mode, the first plurality of memory cells are operatively coupled to the first and third pluralities of electrical contacts via a first plurality of interconnects, and the second plurality of memory cells are operatively coupled to the second and fourth pluralities of electrical contacts via a second plurality of interconnects.

* * * * *